United States Patent
Ishii et al.

[11] 4,008,183
[45] Feb. 15, 1977

[54] HIGH TEMPERATURE ANTICORROSIVE MOLDED PRODUCT

[75] Inventors: Masaji Ishii; Akio Mikogami; Tetsuo Torigai, all of Machida, Japan

[73] Assignee: Denki Kagaku Kogyo Kabushiki Kaisha, Tokyo, Japan

[22] Filed: Aug. 14, 1975

[21] Appl. No.: 604,839

[30] Foreign Application Priority Data

Aug. 15, 1974 Japan .............................. 49-93574

[52] U.S. Cl. ............................... 252/512; 252/516; 252/520; 106/55; 29/182.5; 29/182.7
[51] Int. Cl.² ......................................... H01B 1/02
[58] Field of Search .................. 252/512, 516, 520; 106/55; 29/182.7

[56] References Cited
UNITED STATES PATENTS

| | | | |
|---|---|---|---|
| 3,236,663 | 2/1966 | Grulke et al. ................ | 252/520 X |
| 3,408,312 | 10/1968 | Richards et al. .................... | 106/55 |
| 3,813,252 | 5/1974 | Lipp .................... | 252/520 |
| 3,915,900 | 10/1975 | Reinmuth et al. ................ | 252/520 |
| 3,928,244 | 12/1975 | Passmore .......................... | 252/518 |

Primary Examiner—Benjamin R. Padgett
Assistant Examiner—E. Suzanne Parr
Attorney, Agent, or Firm—Oblon, Fisher, Spivak, McClelland & Maier

[57] ABSTRACT

A high temperature anticorrosive molded product produced by hot pressing a mixture comprising 1–10 weight parts of powdery aluminum and 100 weight parts of a powdery composition comprising an electric conductive refractory, boron nitride and aluminum nitride wherein said powdery composition is encompassed by the range electric conductive refractory : boron nitride : aluminum nitride as shown in the basal triangle of 40 : 20 : 40, 50 : 10 : 40, 70 : 10 : 20, 70 : 20 : 10 and 40 : 50 : 10 of FIG. 1.

3 Claims, 1 Drawing Figure

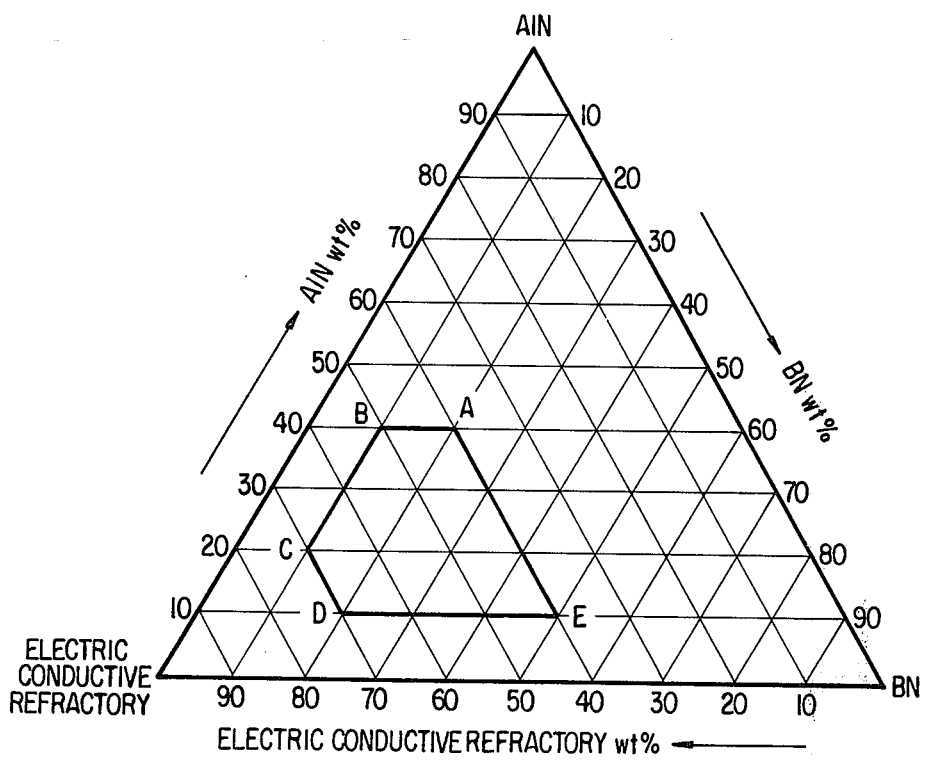

HIGH TEMPERATURE ANTICORROSIVE MOLDED PRODUCT

BACKGROUND OF THE INVENTION

1. Field of the Invention

The present invention relates to a high temperature anticorrosive molded product which is prepared by thermal compression (hot press) of powder comprising an electrically conductive refractory, boron nitride (BN), aluminum nitride (AlN) and aluminum (Al). This product can be used at high temperatures and is suitable for use in the preparation of crucibles, boats or the like which are commonly used for melting or vacuum evaporating high temperature corrosive metals such as aluminum.

2. Description of the Prior Art

Heretofore, it has been proposed to use an electrically conductive anticorrosive refractory, such as $TiB_2$, $ZrB_2$, and the like in order to prepare electrical heating containers for use in evaporation of metals, e.g., aluminum. Aluminum nitride (AlN) decomposes at high temperatures by the following reaction:

$$2AlN \rightarrow 2\,Al + N_2 \uparrow \qquad (1)$$

As a result of the formation of the highly volatile nitrogen gas, it has been difficult to obtain dense products.

In order to adjust only the resistance of the electrically conductive refractory, it is possible to add BN or AlN to the refractory. When BN is added to the refractory, the $TiB_2$ — BN system forms. When using these systems as containers for evaporation of Al, the aluminum reacts with BN as follows:

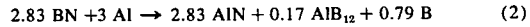

$$2.83\,BN + 3\,Al \rightarrow 2.83\,AlN + 0.17\,AlB_{12} + 0.79\,B \qquad (2)$$

The result is the formation of $AlB_{12}$ and B, which possess inferior anticorrosive properties and heat resistance. On the other hand, when AlN is added to the refractory, $TiB_2$—AlN is formed and the resulting molded product will be characterized by low thermal shock resistance. The resulting product can thus not be used as a container for vacuum evaporation or the like, particularly where rapid heating and cooling may occur. The specific resistances of $TiB_2$ and $ZrB_2$ used in the electrically conductive refractory of this invention are, respectively, 14.4 $\mu\Omega$-cm and 16.6 $\mu\Omega$-cm. (*Plenum Press Handbook of High Temperature Materials*, Plenum Press, New York, 1964).

In order to prepare a molded product having a specific resistance of 100–2000 $\mu\Omega$-cm, as is required for heating containers, such as crucible boats used for vacuum evaporation, it is necessary to add 20–70 wt. % of an electrically insulating anticorrosive material, such as BN, AlN, etc. When 20–70 wt. % of only BN or AlN is added to the refractory, the above-mentioned disadvantages result. In addition, even though a combination of BN and AlN is added to the refractory, decomposition of AlN at the high temperatures used in the molding operation occurs and it is difficult to obtain a dense product and low anticorrosive properties when in contact with molten metals. The inventors have studied the above-mentioned findings and have found that these disadvantages can be overcome by adding a combination of AlN, BN and Al to the electrically conductive refractory.

SUMMARY OF THE INVENTION

Accordingly, it is one object of the present invention to provide a high temperature anticorrosive molded product which has a suitable specific resistance, a high apparent density, and is not easily corroded by molten metals.

This object, and other objects of this invention, as will hereinafter become more readily understood by the following description, have been attained by providing a high temperature, anticorrosive molded product produced by hot pressing a mixture comprising 1–10 wt. parts of a fine powdered aluminum and 100 wt. parts of a fine powdered composition of an electrically conductive refractory, boron nitride and aluminum nitride in the range of A point (40 : 20 : 40), B point (50 : 10 : 40), C point (70 : 10 : 20), D point (70 : 20 : 10) and E point (40 : 50 : 10) of the basal triangular coordinates of FIG. 1.

BRIEF DESCRIPTION OF THE DRAWINGS

A more complete appreciation of this invention and the many attendant advantages thereof can be readily attained by reference to the following detailed description when considered in connection with the accompanying drawing, wherein:

FIG. 1 is a basal triangular coordinate diagram of the system electrically conductive refractory : BN : AlN.

DETAILED DESCRIPTION OF THE PREFERRED EMBODIMENTS

In the high temperature, anticorrosive compositions of this invention, AlN is added to adjust the specific resistance, BN is added to improve thermal shock resistance, and Al is added to prevent decomposition and evaporation of AlN, resulting in a dense molded product. It is not desirable to add excess BN, since molten metals such as Al will react with the BN near the surface of the molded product by reaction (2). This results in decay of the product properties. When a small amount of Al is added to the combination of BN and AlN, the electrically conductive refractory becomes highly bonded with small amounts of $AlB_{12}$ and B which are formed by reaction (2) at high temperatures. The strength of the molded product is thereby improved. Further, a layer of these compounds forms around AlN effectively preventing its decomposition. The particle size (average diameter) of BN, AlN, electrically conductive anticorrosive refractory and Al are as follows:

BN : 0.1–10 $\mu$, preferably 1–8 $\mu$;
AlN : 1–44 $\mu$, preferably 3–15 $\mu$;
electrically conductive anticorrosive refractory: 1–44 $\mu$, preferably 3–15 $\mu$;
Al : 0.1–10 $\mu$, preferably 2–8 $\mu$.

It is preferable to add 1–10 wt. parts, especially 3–7 wt. parts of Al to 100 wt. parts of the total amount of the electrically conductive refractory, with BN and AlN. If the amount of Al is less than 1 wt. part, substantial decomposition of AlN occurs during the sintering operation, and it is difficult to obtain a dense molded product. If the Al content is more than 10 wt. parts, the molded product is dense. However, a large amount of corrosive material containing Al remains. In this case, when the molded product is used as a container for melting or evaporating metals, deformation, cracks, and abnormal corrosion of the container occur. The amounts of the electrically conductive refractory, AlN and BN are preferably in a range of the limits shown in the basal triangular coordinate diagram of FIG. 1. Regardless of the amount of aluminum used, the specific resistance, the anticorrosive property or the thermal shock resistance of the molded product are not suitable for the purposes of this invention if the amounts of electrically conductive refractory, AlN and BN are outside the limits shown in FIG. 1. Electrically conductive refractory means a material having a specific resistance of less than 100 $\mu\Omega$-cm at room temperature and a melting point of higher than 2300° C which is anticorrosive to molten metals. Typical electrically conductive refractories include $TiB_2$, $ZrB_2$, TiC, ZrC or the like. It is preferable to employ a hot press method for preparing the molded product. The powdery mixture of the raw materials can be molded by conventional methods such as by adding to a graphite mold and compressing at 1600°–2300° C under a pressure of 30–350 Kg/cm$^2$ in a nonoxidative atmosphere.

Having generally described the invention, a more complete understanding can be obtained by reference to certain specific Examples, which are provided for purposes of illustration only and are not intended to be limiting unless otherwise specified.

mold and the mold was set in a hot press (hot press apparatus). After evacuating to 10$^3$ Torr, the mold was heated to 2000° C at a rate of 1500° C/hour and was subsequently kept at 2000° C for 30 minutes. After completing the molding operation, the porosity and the specific resistance of the resulting block were measured. The boats used for the vacuum evaporation coating experiments (a rod having a length of 100 mm, a width of 6 mm and a thickness of 4 mm which has a cavity having a width of 4 mm, a length of 40 mm and a depth of 2 mm) were prepared by machining the blocks. Each boat was set in a vacuum evaporation coating apparatus and the evaporation test was repeated by using 0.3 g of aluminum each time. The time required for completing the evaporation in each operation was about 1 minute. The life of each boat was shown by the number of repetitions (cycles) that resulted in an increase in the resistance of the boat by 20 % of the initial resistance or that caused a deformation or a crack in the boat (lesser number of them). The results are shown in Table 1. The amount of Al is shown by weight percent to total amounts of $TiB_2$, AlN and BN.

TABLE 1

| Test No. | Amount of raw materials (wt. %) | | | | Specific resistance ($\mu\Omega$-cm) | Life of boat Porosity (%) | (times repeated) | |
|---|---|---|---|---|---|---|---|---|
| | $TiB_2$ | AlN | BN | Al | | | | |
| 1 | 45 | 35 | 20 | 7 | 1500 | 2.8 | 420 | |
| 2 | 50 | 35 | 15 | " | 970 | 3.5 | 380 | |
| 3 | 65 | 20 | 15 | " | 450 | 4.2 | 350 | |
| 4 | 65 | 15 | 20 | " | 490 | 3.9 | 355 | |
| 5 | 45 | 15 | 40 | " | 1890 | 6.8 | 220 | |
| 6 | 50 | 20 | 30 | " | 1210 | 4.0 | 330 | |
| 7 | 45 | 35 | 20 | 3 | 1940 | 3.3 | 401 | |
| 8 | 50 | 35 | 15 | 3 | 620 | 4.1 | 340 | |
| 9 | 65 | 20 | 15 | 3 | 600 | 4.2 | 335 | |
| Ref. | | | | | | | | |
| 10 | 50 | 0 | 50 | 7 | 890 | 9.2 | 18 | *1 |
| 11 | 50 | 50 | 0 | 7 | 680 | 5.4 | — | *2 |
| 12 | 50 | 5 | 45 | 7 | 810 | 8.8 | 22 | *3 |
| 13 | 50 | 45 | 5 | 7 | 720 | 4.3 | — | *4 |

NOTE:
*1; *3 A deformation was caused in the first cycle.
*2; *4 A crack was caused in the first cycle and it was difficult to continue the operation.

EXAMPLE 1

$TiB_2$ (325 mesh pass; manufactured by Hermann C. Starck), AlN (200 mesh pass; manufactured by Hermann C. Starck), BN (manufactured by Denki Kagaku Kogyo K.K.) and Al powder [Al(At)-250 mesh manufactured by Fukuda Kinzokuhakufun K.K.] were mixed at the ratios shown in Table 1 in a ball mill using alumina balls for 1 hour. A cylindrical graphite mold having an outer diameter of 220 mm, an inner diameter of 110 mm and a length of 280 mm was filled with this mixture. Rods for compression were respectively inserted from the upper and lower part of the graphite

EXAMPLE 2

In accordance with the process of Example 1 and using the same raw materials, boats having the same size were prepared from the blocks. Each boat was set in a vacuum evaporation coating apparatus and evaporation tests of aluminum were conducted by using 0.3 g of aluminum each time.

The life of each boat is shown in Table 2 in the same manner as Example 1. The amount of Al is shown by weight percent to total amounts of $TiB_2$, AlN and BN.

TABLE 2

| Test No. | Amount of raw materials (wt. %) | | | | Specific resistance ($\mu\Omega$-cm) | Porosity (%) | Life of boat (times repeated) | |
|---|---|---|---|---|---|---|---|---|
| | $TiB_2$ | AlN | BN | Al | | | | |
| 1 | 48 | 22 | 30 | 4 | 1800 | 3.3 | 455 | |
| 2 | 48 | 22 | 30 | 7 | 1500 | 2.3 | 310 | |
| Ref. | | | | | | | | |
| 3 | 48 | 22 | 30 | 10 | 1300 | 0.0 | 25 | *5 |
| 4 | 48 | 22 | 30 | 0 | 500 | 18.3 | 3 | *6 |

NOTE:
*5 A crack was caused in the 25th cycle with excessive deformation.
*6 A crack was caused in the 3rd cycle.

EXAMPLE 3

The same raw materials of $TiB_2$, BN, AlN and Al used in Example 1 were used in this example. In addition, TiC (325 mesh pass, manufactured by Nippon Shinkinzoku K.K.), ZrC (325 mesh pass, manufactured by Hermann C. Starck), and $ZrB_2$ (325 mesh pass, manufactured by Hermann C. Starck), were admixed with these materials at the ratios shown in Table 3. In accordance with the process of Example 1, cylindrical blocks having a diameter of 100 mm and a length of 150 mm were molded by the hot press method. Boats having the same size as those of Example 1 were prepared by machining these blocks. Vacuum evaporation coating tests of the boats were conducted in accordance with the procedure of Example 1. The results are shown in Table 3.

TABLE 3

| Test No. | Amount of raw materials (wt. %) conductive refractory | AlN | BN | Al | Specific resistance ($\mu\Omega$-cm) | Porosity (%) | Life of boat (times repeated) |
|---|---|---|---|---|---|---|---|
| 1 | $TiB_2$ 45 | 35 | 20 | 7 | 1500 | 2.8 | 420 |
| 2 | $ZrB_2$ 45 | 35 | 20 | 7 | 1620 | 2.1 | 530 |
| 3 | TiC 45 | 35 | 20 | 7 | 1830 | 2.3 | 410 |
| 4 | ZrC 45 | 35 | 20 | 7 | 1770 | 4.6 | 380 |

The amount of Al is shown by weight percent to total amounts of the conductive refractory, AlN, and BN.

As is clear from Examples 1–3, it is necessary to combine BN, AlN and Al with an electrically conductive refractory in order to obtain a molded product having good anticorrosive properties to molten metals and high thermal shock resistance.

Having now fully described the invention, it will be apparent to one of ordinary skill in the art that many changes and modifications can be made thereto without departing from the spirit or scope of the invention as set forth herein.

What is claimed as new and intended to be covered by Letters Patent is:

1. A high temperature, anticorrosive molded product produced by hot pressing a mixture, comprising 1–10 parts by weight of powdered aluminum and 100 parts by weight of a powdered composition of an electrically conductive refractory, boron nitride and aluminum nitride wherein said powdery composition is encompassed by the range electrically conductive refractory: boron nitride: aluminum nitride as shown in the basal triangle of 40:20:40, 50:10:40, 70:10:20, 70:20:10 and 40:50:10 of FIG. 1, and wherein said electrically conductive refractory is a material having a specific resistance of less than $100\mu\Omega$-cm at room temperature and a melting point greater than 2300° C.

2. The high temperature anticorrosive molded product of claim 1, wherein the electrically conductive refractory comprises $TiB_2$, $ZrB_2$, TiC, ZrC or a mixture thereof as a main component.

3. The high temperature anticorrosive molded product according to claim 1, wherein 3–7 wt. % of a fine aluminum powder is added based on the total amount of the electrically conductive refractory, boron nitride and aluminum nitride.

* * * * *